(12) United States Patent
Iguchi (10) Patent No.: US 8,829,648 B2
(45) Date of Patent: Sep. 9, 2014

(54) PACKAGE SUBSTRATE AND SEMICONDUCTOR PACKAGE

(71) Applicant: Fuji Xerox Co., Ltd., Tokyo (JP)

(72) Inventor: Daisuke Iguchi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/755,090

(22) Filed: Jan. 31, 2013

(65) Prior Publication Data

US 2013/0228895 A1    Sep. 5, 2013

(30) Foreign Application Priority Data

Mar. 5, 2012  (JP) ................................. 2012-047950

(51) Int. Cl.
*H01L 29/00* (2006.01)

(52) U.S. Cl.
USPC ............ 257/532; 257/535; 257/758; 438/622

(58) Field of Classification Search
USPC ........... 257/532, 535, 758, E29.342; 438/622
See application file for complete search history.

(56) References Cited

U.S. PATENT DOCUMENTS

| 7,990,228 B2 | 8/2011 | Uematsu |
| 2007/0242440 A1* | 10/2007 | Sugaya et al. ................. 361/762 |
| 2008/0266031 A1 | 10/2008 | Uematsu et al. |

FOREIGN PATENT DOCUMENTS

| JP | 2738590 B2 | 4/1998 |
| JP | 2008258312 A | 10/2008 |
| WO | 91/02647 A1 | 3/1991 |

OTHER PUBLICATIONS

Office Action issued by Japanese Patent Office in corresponding Japanese Patent application No. 2012047950, dated Jul. 23, 2013.

\* cited by examiner

*Primary Examiner* — Theresa T Doan
(74) *Attorney, Agent, or Firm* — Sughrue Mion, PLLC (57) ABSTRACT

A semiconductor package includes a semiconductor element, a capacitor, and a package substrate. The capacitor supplies transient current to the semiconductor element. The semiconductor element and the capacitor are mounted on the package substrate. The semiconductor element includes an integrated circuit, a first connecting part, and a second connecting part. The capacitor includes a third connecting part and a fourth connecting part. The package substrate includes a first metallic layer, a second metallic layer, and a dielectric layer. The first metallic layer includes a first conductive region, a second conductive region, a third conductive region, and a fourth conductive region. The first conductive region is connected via a fifth connecting part to the second metallic layer. The third conductive region is connected via a sixth connecting part to the second metallic layer. The second and fourth conductive regions are connected to each other inside the first metallic layer.

18 Claims, 11 Drawing Sheets

PACKAGE SUBSTRATE AND SEMICONDUCTOR PACKAGE

CROSS-REFERENCE TO RELATED APPLICATIONS

This application is based on and claims priority under 35 USC 119 from Japanese Patent Application No. 2012-047950 filed Mar. 5, 2012.

BACKGROUND

Technical Field

The present invention relates to a package substrate and a semiconductor package.

SUMMARY

According to an aspect of the invention, there is provided a semiconductor package including a semiconductor element, a capacitor, and a package substrate. The capacitor supplies transient current to the semiconductor element. The semiconductor element and the capacitor are mounted on the package substrate. The semiconductor element includes an integrated circuit, a first connecting part that connects the integrated circuit to one of an external power supply potential and an external reference potential, and a second connecting part that connects the integrated circuit to the other one of the power supply potential and the reference potential. The capacitor includes a third connecting part that is connected to one of the power supply potential and the reference potential and a fourth connecting part that is connected to the other one of the power supply potential and the reference potential. The package substrate includes a first metallic layer, a second metallic layer, and a dielectric layer that is arranged between the first metallic layer and the second metallic layer. The first metallic layer includes a first conductive region in which one of the first connecting part and the second connecting part of the semiconductor element is mounted, a second conductive region in which the other one of the first connecting part and the second connecting part of the semiconductor element is mounted, a third conductive region in which one of the third connecting part and the fourth connecting part of the capacitor is mounted, and a fourth conductive region in which the other one of the third connecting part and the fourth connecting part of the capacitor is mounted. The first conductive region is connected via a fifth connecting part to the second metallic layer. The third conductive region is connected via a sixth connecting part to the second metallic layer. The second conductive region and the fourth conductive region are connected to each other inside the first metallic layer.

BRIEF DESCRIPTION OF THE DRAWINGS

Exemplary embodiments of the present invention will be described in detail based on the following figures, wherein.

DETAILED DESCRIPTION

Configuration of Semiconductor Package

Figure 1A:
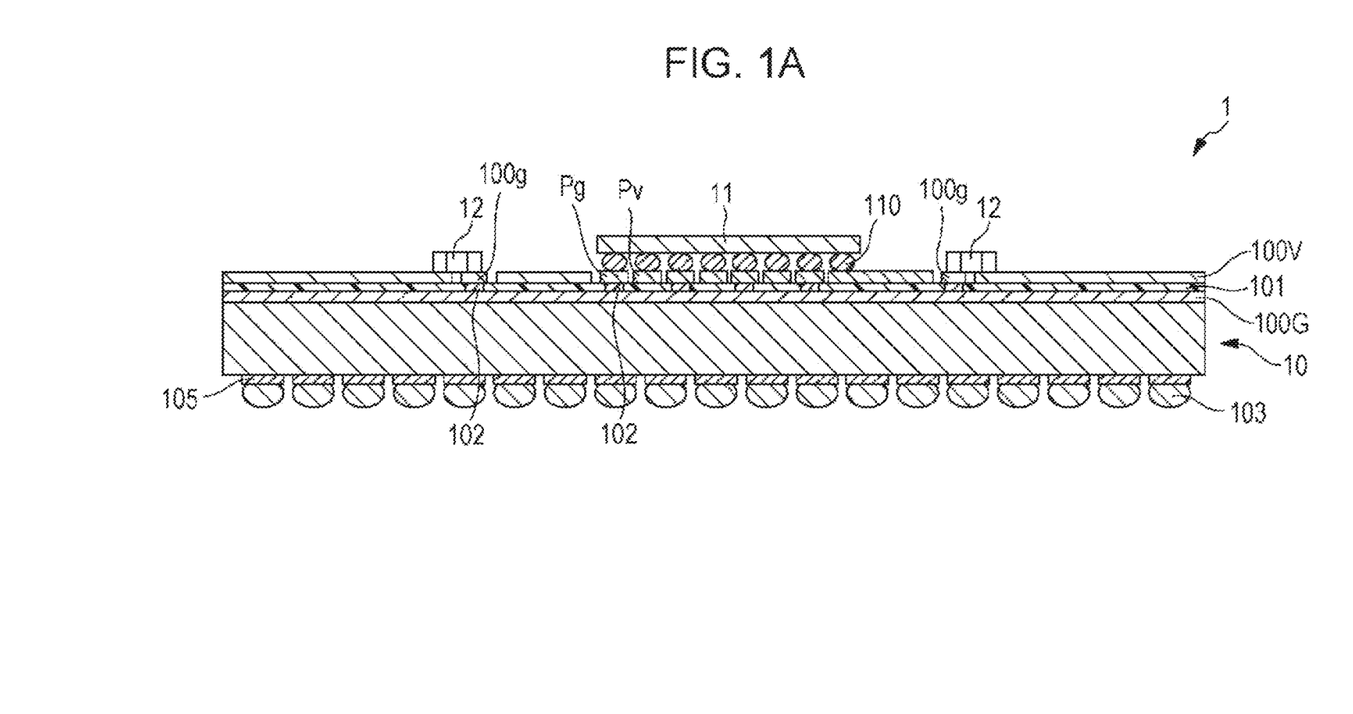
FIG. 1A is a cross-sectional view illustrating an example of the configuration of a semiconductor package according to an exemplary embodiment of the present invention.
Figure 1B:
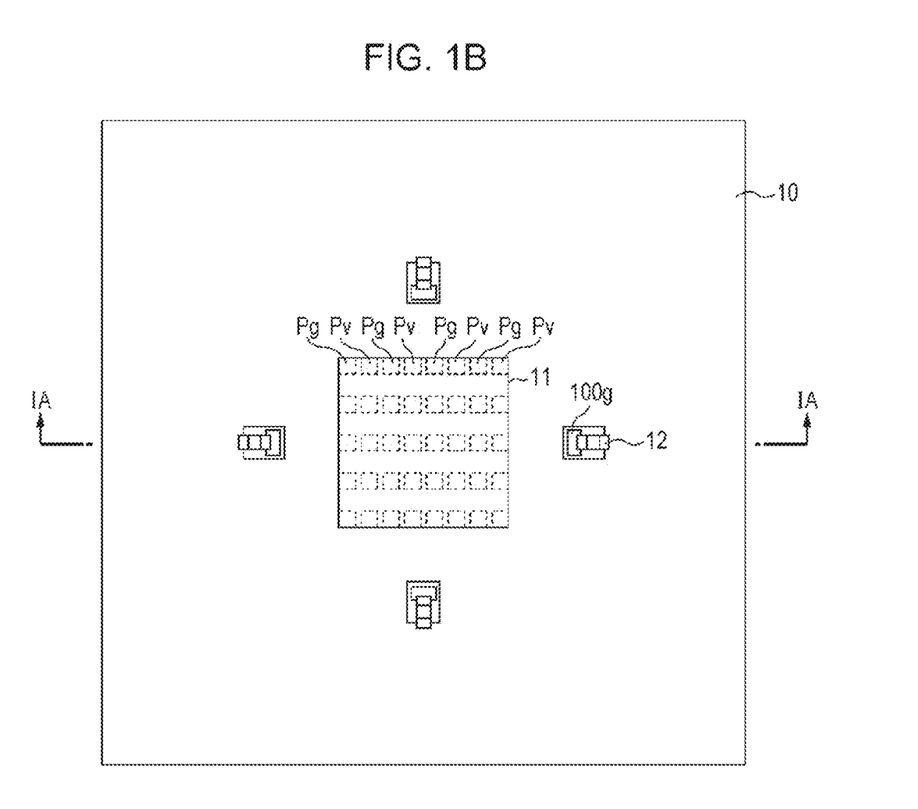
FIG. 1B is a plan view illustrating an example of the configuration of the semiconductor package according to the exemplary embodiment of the present invention.

FIG. 1A is a cross-sectional view illustrating an example of the configuration of a semiconductor package according to an exemplary embodiment of the present invention. FIG. 1A illustrates the cross section of the semiconductor package taken along line IA-IA of FIG. 1B. FIG. 1B is a plan view illustrating an example of the configuration of the semiconductor package according to the exemplary embodiment of the present invention.

A semiconductor package 1 includes a package substrate 10 having a multilayer structure. The semiconductor package 1 also includes a semiconductor element 11 including an integrated circuit, such as a large scale integration (LSI), and capacitors 12. The semiconductor element 11 and the capacitors 12 are arranged on the package substrate 10.

The package substrate 10 includes a metallic layer 100V, a dielectric layer 101, and a metallic layer 100G. The metallic layer 100V is arranged over one surface of the package substrate 10. The dielectric layer 101 is arranged over a portion more inward of the package substrate 10 than the metallic layer 100V and is preferably in contact with the metallic layer 100V. The metallic layer 100G is arranged over a portion more inward of the package substrate 10 than the dielectric layer 101 and is preferably in contact with the dielectric layer 101. That is, the package substrate 10 has a configuration in which the metallic layer 100G, the dielectric layer 101, and the metallic layer 100V are stacked in that order from the innermost to outermost of the package substrate 10, and the metallic layer 100V is located at the one surface of the package substrate 10. A protection film or the like may be arranged over the surface of the metallic layer 100V, which is located at the one surface of the package substrate 10.

The metallic layer 100V is a layer on which connecting parts, such as bumps for the semiconductor element 11 and terminals of the capacitors 12, are directly mounted. As explained later, the metallic layer 100V, the metallic layer 100G, and the dielectric layer 101 function as transmission paths for supplying transient current from the capacitors 12 to the semiconductor element 11.

Furthermore, the metallic layer 100V includes a first conductive region, a second conductive region, a third conductive region, and a fourth conductive region. The semiconductor element 11 is mounted in the first conductive region, and the first conductive region is connected to a reference potential. The semiconductor element 11 is mounted in the second conductive region, and the second conductive region is connected to a power supply potential. One terminals (electrodes) of the capacitors 12 are mounted in the third conductive region, and the third conductive region is connected to the reference potential. The other terminals of the capacitors 12 are mounted in the fourth conductive region, and the fourth conductive region is connected to the power supply potential.

The first conductive region and the third conductive region are connected through vias 102 to the metallic layer 100G. The metallic layer 100G is connected through different vias, which are arranged inside the package substrate 10, to pads 105 and bumps 103 arranged on the surface of the package substrate 10 opposite the surface of the package substrate 10 on which the metallic layer 100V is arranged. The second conductive region and the fourth conductive region, which are connected to the power supply potential, are connected through different vias arranged inside the package substrate 10 to pads 105 and bumps 103 that are different from the pads 105 and the bumps 103 connected to the first conductive region and the third conductive region. Power is supplied to the second conductive region and the fourth conductive region from a printed wiring board or the like arranged outside.

Furthermore, as illustrated in FIG. 1B, the fourth conductive region is arranged in such a manner that the continuous surface thereof surrounds the third conductive region. The fourth conductive region is also arranged in such a manner that the continuous surface thereof surrounds the first conductive region and the second conductive region. In this exemplary embodiment, the first and second conductive regions are arranged in a substantially central area of the package substrate 10, the fourth conductive region surrounds around the area where the first and second conductive regions are arranged, and the third conductive region is arranged in a dispersed manner around the first and second conductive regions.

The metallic layers 100V and 100G of the package substrate 10 are formed of copper or the like in a normal stacking method. Furthermore, for the dielectric layer 101, for example, a resin thin film, such as polyimide, or FaradFlex BC12TM, BC8, or the like commercially available as a product dedicated to an embedded capacitor may be used. The thickness of the dielectric layer 101 is, for example, 100 μm or less or approximately 100 μm or less, preferably, 30 μm or less or approximately 30 μm or less, and more preferably, 15 μm or less or approximately 15 μm or less. For the case of the dielectric layer 101 having a thickness of 15 μm or less, for example, a dielectric layer 101 having a relative dielectric constant of 4.4 and a thickness of 8 μm, a dielectric layer 101 having a relative dielectric constant of 30 and a thickness of 8 μm, or the like may be used.

The semiconductor package 1 is mounted on a printed wiring board, which is not illustrated, and is electrically connected via the bumps 103 on pads on the printed wiring board. The printed wiring board includes a power supply circuit. Power supplied from the power supply circuit of the printed wiring board is supplied via the bumps 103 to the metallic layer 100V and the metallic layer 100G. For example, the metallic layer 100V has a power supply potential and the metallic layer 100G has a reference potential (ground potential). The case where the metallic layer 100V has a power supply potential and the metallic layer 100G has a reference potential is explained in this exemplary embodiment. However, also in other exemplary embodiments, the arrangement of the metallic layer 100V and the arrangement of the metallic layer 100G may be replaced with each other, and the surface side of the package substrate 10 may be set to the reference potential.

The semiconductor element 11 is mounted on pads Pv and Pg of the package substrate 10 with plural bumps 110 therebetween. The pads Pv and Pg correspond to the first and second conductive regions of the metallic layer 100V, respectively. Power is supplied from the metallic layers 100V and 100G to the pads Pv and Pg, respectively, and the semiconductor element 11 receives supplied power. Furthermore, the semiconductor element 11 is electrically connected to different pads and a different layer inside the package substrate 10 to transmit and receive a signal other than power supply.

Although the case where twenty pairs of the pads Pv and Pg are arranged is illustrated as an example in FIG. 1B, the number of pairs of the pads Pv and Pg is not limited to this.

The capacitors 12 each supply to the semiconductor element 11 current to be consumed transiently. One terminal of the capacitor 12 is mounted in the third conductive region of the metallic layer 100V and the other terminal of the capacitor 12 is arranged in the fourth conductive region. That is, the one terminal of the capacitor 12 is connected through a via to the metallic layer 100G, and the other terminal of the capacitor 12 is directly mounted in the fourth conductive region having a wide metallic surface surrounding the first and second conductive regions and is connected without through a via. With this configuration, during a transient period, current from the capacitor 12 is supplied via the metallic layer 100V, the dielectric layer 101, and the metallic layer 100G functioning as a low-impedance transmission path to the semiconductor element 11.

The capacitor 12 is, for example, a low-ESL laminated ceramic capacitor element. As described later, four capacitors 12 having a capacitance of 0.25 μF or 1 μF are mounted on the package substrate 10. However, the capacitance and the number of capacitors are not limited to this.

As described above, in terms of the laminated structure, a capacitor is formed by a combination of the metallic layer 100V, the dielectric layer 101, and the metallic layer 100G. However, in this exemplary embodiment, the metallic layer 100V, the dielectric layer 101, and the metallic layer 100G are configured so as to function as a low-impedance transmission path for supplying transient current from the capacitor 12 to the semiconductor element 11, rather than so as to store electric charge for supplying transient current to the semiconductor element 11.

Although the fourth conductive region surrounds, with the continuous surface thereof, the first, the second, and the third conductive regions as illustrated in FIG. 1B in this exemplary embodiment, the fourth conductive region may not be configured so as to completely surround the first, the second, and the third conductive regions. The fourth conductive region may have any shape and area as long as it functions as a low-impedance transmission path for supplying transient current from the capacitor 12 to the semiconductor element 11. For example, the fourth conductive region may have any shape and area as long as the area is sufficiently larger than the linewidth generally used for a package substrate and the impedance of the transmission path from the position where the capacitor 12 is mounted to the semiconductor element 11 is lower than the impedance of the capacitor 12 in a frequency bandwidth of transient current to be supplied. As described above, with the configuration in which the transmission path from the position where the capacitor 12 is mounted to the semiconductor element 11 has low impedance, the combination of the metallic layer 100V, the dielectric layer 101, and the metallic layer 100G may have any shape.

Furthermore, although connection between the semiconductor element 11 and the package substrate 10 and connection between the package substrate 10 and the printed wiring board are implemented with pads and bumps in this exemplary embodiment, any other connecting members and connection configurations may be used as long as electrical connection is implemented.

Furthermore, although it is desirable that connecting members inside the package substrate 10 are vias, for example, a different connection configuration such as through holes may be arranged.

Furthermore, in this exemplary embodiment, the metallic layer 100G is arranged at a position closer to the surface of the package substrate 10 on which the semiconductor element 11 is mounted than the central plane in the thickness direction of the package substrate 10. With this arrangement, the inductance components by the vias 102 are efficiently suppressed. However, the metallic layer 100G may not be arranged as described above. The metallic layer 100G may be arranged at a position closer to the opposite surface.

Furthermore, although it is desirable that only the dielectric layer 101 is provided between the metallic layer 100V and the metallic layer 100G, a different layer may be provided between the metallic layer 100V and the metallic layer 100G.

Furthermore, in this exemplary embodiment, the semiconductor element 11 and the capacitors 12 are "directly" mounted in the first to fourth conductive regions of the metallic layer 100V. Here, "directly" represents a way in which the semiconductor element 11 and the capacitors 12 are mounted without through a connecting member that affects, as an inductance component, supply of transient current, and does not represent a way in which the semiconductor element 11 and the capacitors 12 are totally directly mounted. For example, the surface of the metallic layer 100V may be plated or the like. Furthermore, "directly" includes the case where the semiconductor element 11 and the capacitors 12 are mounted through a connecting member such as solder or the like when it does not substantially affect, as an inductance component, supply of transient current.

Working Example 1

Under the condition that the dielectric layer 101 having a relative dielectric constant of 30, a thickness of 10 µm, and a size of 19.2 mm² is used, the electrostatic capacitance C of a capacitor formed of the metallic layer 100G, the metallic layer 100V, and the dielectric layer 101 is 3264 pF and the impedance Z of a transmission path between the capacitor 12 and the semiconductor element 11 is 4.87Ω (10 MHz) and 0.487Ω (100 MHz).

Under the condition mentioned above, the impedance characteristics of the transmission path between the capacitor 12 and the semiconductor element 11 in the case where four capacitors 12 having an electrostatic capacitance of 0.25 µF or 1 µF (ESL=0.1 nH, ESR=0.1Ω) are arranged on the package substrate 10 as illustrated in FIG. 1B will be described below.

Figure 2:
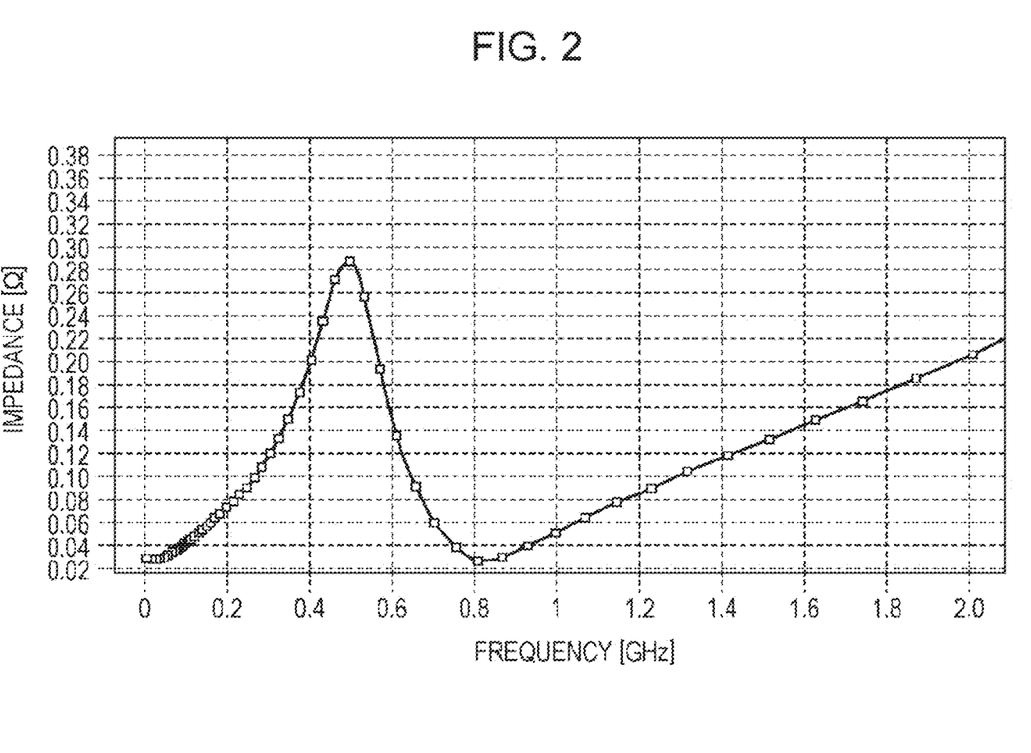
FIG. 2 is a graph illustrating an example of the impedance characteristics of the semiconductor package according to the exemplary embodiment of the present invention.

FIG. 2 is a graph illustrating an example of the impedance characteristics of the semiconductor package 1 according to an exemplary embodiment of the present invention.

The semiconductor package 1 exhibits similar impedance characteristics, irrespective of the capacitance of the capacitor 12 (0.25 µF or 1 µF). Although the semiconductor package 1 has the anti-resonance peak in the vicinity of 0.5 GHz, the impedance is 0.3Ω or less over the entire range of 2.0 GHz or less. The characteristics mentioned above are exhibited in the case where the power supply from the metallic layers 100V and 100G is connected to the semiconductor element 11 with twenty pairs of connection points. For example, with one hundred pairs of connection points, the impedance characteristics are reduced to ⅕, which is 0.1Ω or less or approximately 0.1Ω or less, and a value sufficient for operation in a high frequency region of 2.0 GHz or less or approximately 2.0 GHz or less is achieved.

Figure 7:
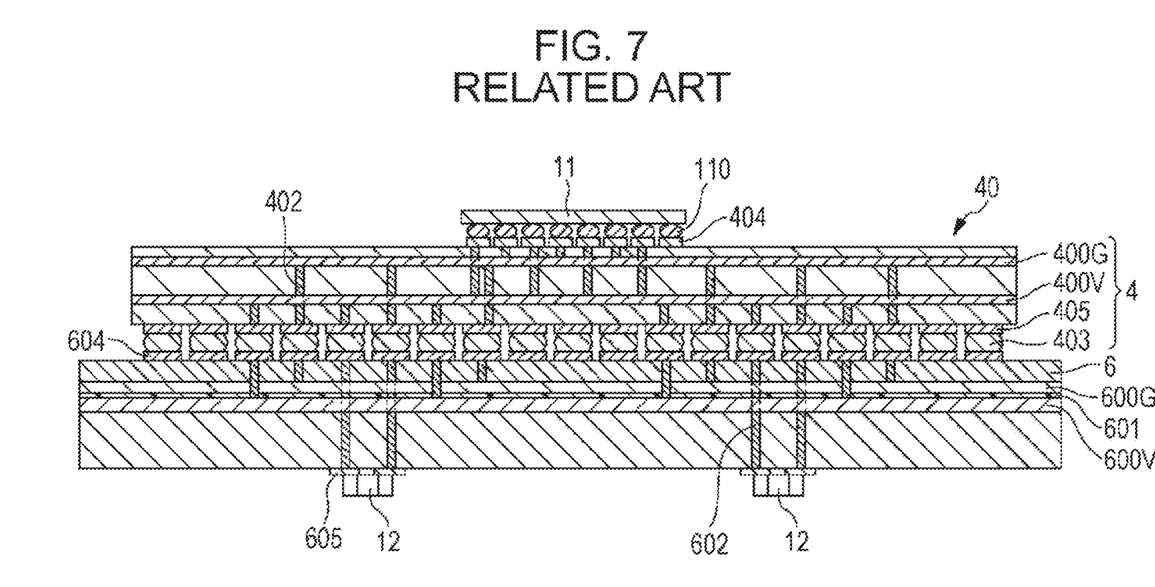
FIG. 7 is cross-sectional view illustrating an example of the configuration of a semiconductor package of a related art.

Compared to comparative example 1 explained below and a related art illustrated in FIG. 7, transient current, which is supplied from the capacitor 12 and which causes radiation electromagnetic noise, does not flow into the printed wiring board.

Hereinafter, comparison between the impedance characteristics of this working example and the impedance characteristics of comparative examples will be described.

Comparative Example 1

Figure 3:
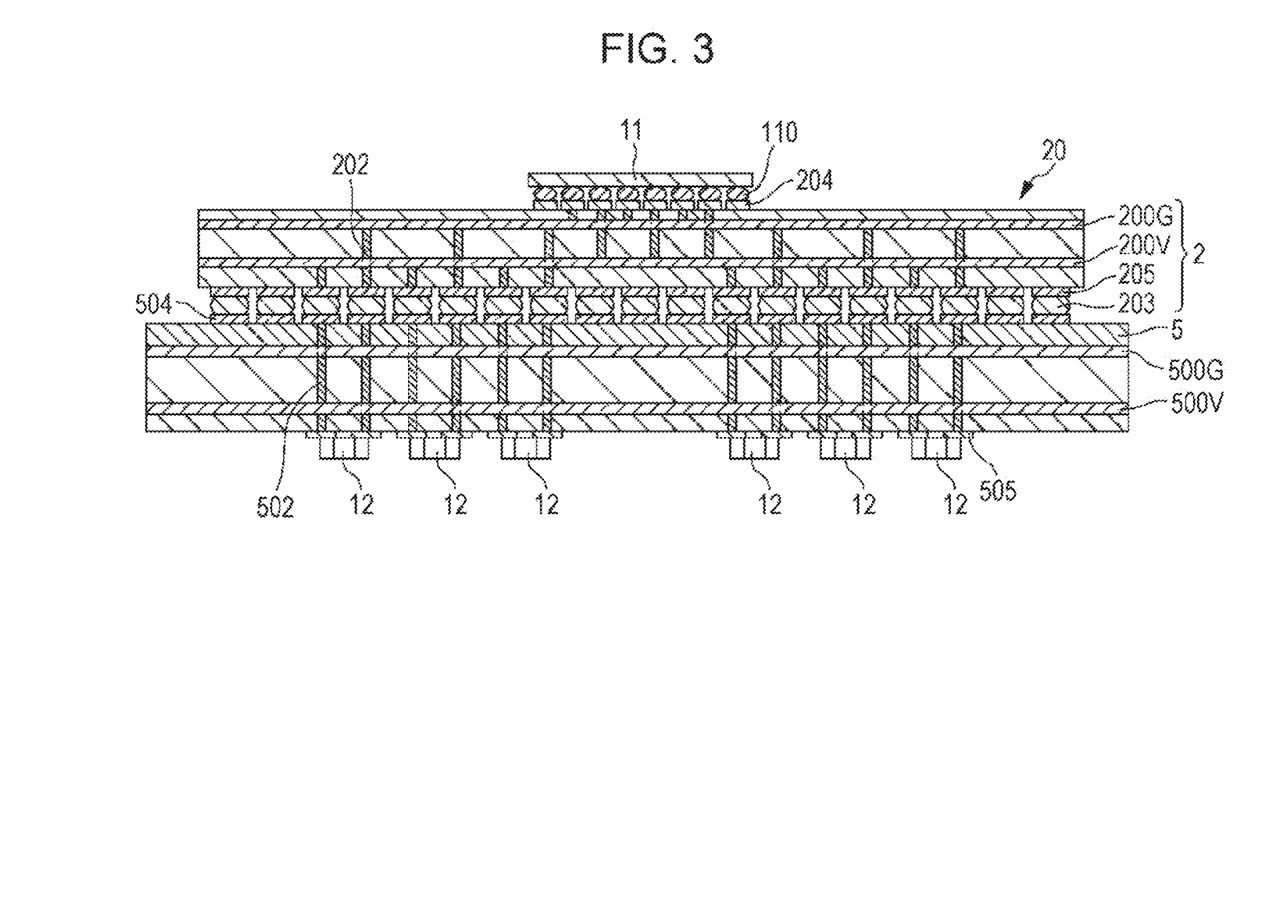
FIG. 3 is a cross-sectional view illustrating an example of the configuration of a semiconductor package of a comparative example.

FIG. 3 is a cross-sectional view illustrating an example of the configuration of a semiconductor package of a comparative example.

A semiconductor package 2 includes a package substrate 20, the semiconductor element 11, and the like. The package substrate 20 is a multi-layered substrate and includes metallic layers 200V and 200G. The semiconductor package 2 and the capacitors 12 are mounted on a printed wiring board 5.

The package substrate 20 includes the metallic layers 200V and 200G, pads 205, and bumps 203. The pads 205 and the bumps 203 are arranged on the lower surface of the package substrate 20, and part of the metallic layers 200V and 200G and some of the pads 205 are electrically connected through vias 202. Power is supplied from a power supply circuit or the like, which is not illustrated, via pads 504 of the printed wiring board 5 to the metallic layers 200V and 200G. The metallic layer 200V has a power supply potential, and the metallic layer 200G has a reference potential.

Furthermore, the package substrate 20 is electrically connected to the semiconductor element 11 with bumps 110 and pads 204 therebetween. some of the pads 204 are electrically connected to the metallic layers 200V and 200G through the vias 202.

The printed wiring board 5 includes metallic layers 500G and 500V and the capacitors 12. The metallic layers 500G and 500V are connected to a power supply circuit, which is not illustrated. The capacitors 12 are mounted on pads 505 on the lower surface of the printed wiring board 5. The metallic layers 500G and 500V are electrically connected to the capacitors 12 through vias 502.

In the configuration mentioned above, the impedance characteristics of transmission paths between the capacitors 12 and the semiconductor element 11 in the case where the mounting inductance of the bumps 110 and 203, the pads 204, 205, 504, and 505, the vias 202 and 502, and the capacitors 12 is set to ESL=2 nH when thirty capacitors 12 having an electrostatic capacitance of 1 µF (ESR=0.1Ω) are arranged on the printed wiring board 5 will be described below.

Figure 4:
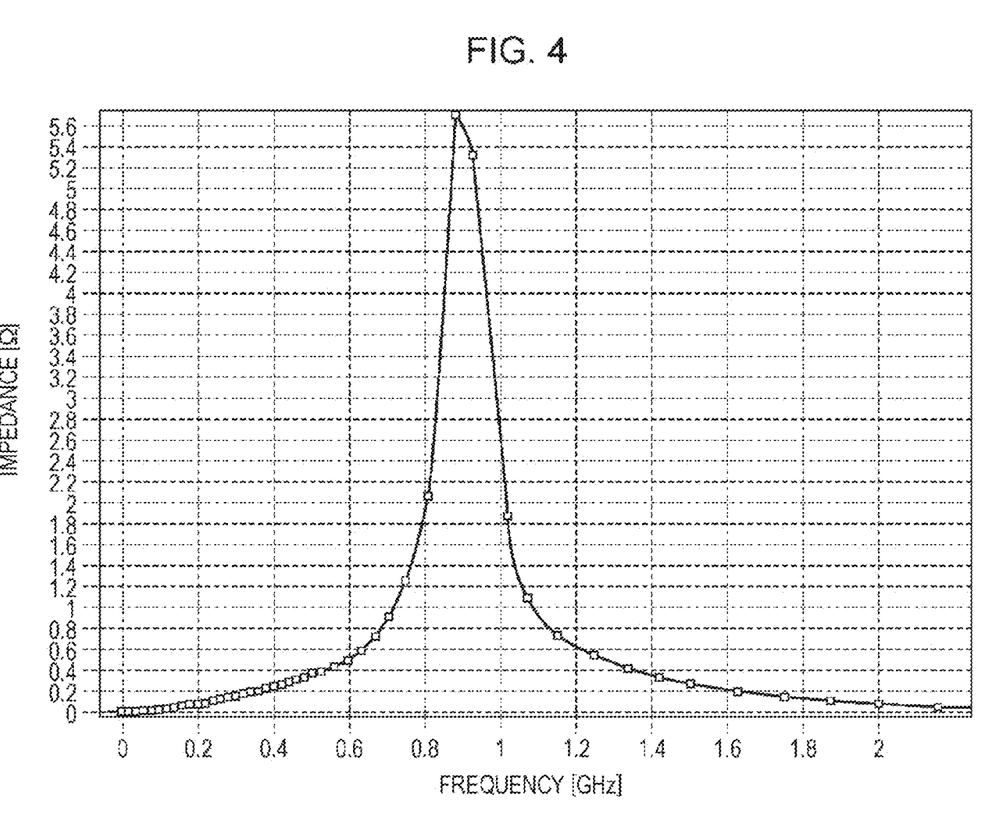
FIG. 4 is a graph illustrating an example of the impedance characteristics of the semiconductor package of the comparative example.

FIG. 4 is a graph illustrating an example of the impedance characteristics of the semiconductor package 2 and the printed wiring board 5 of the comparative example.

The impedance characteristics of the semiconductor package 2 and the printed wiring board 5 have the anti-resonance peak in the vicinity of 0.9 GHz. The value of the anti-resonance peak is 5.6Ω, which is twenty times higher than this working example even though the number of the capacitors 12 is seven or more times higher than this working example. In this case, in order to enable the semiconductor element 11 to operate at high speed, a cell including a capacitor for supplying transient current necessary for high-speed operation as well as a cell including a calculating circuit for the semiconductor element 11 needs to be provided.

Comparative Example 2

Figure 5:
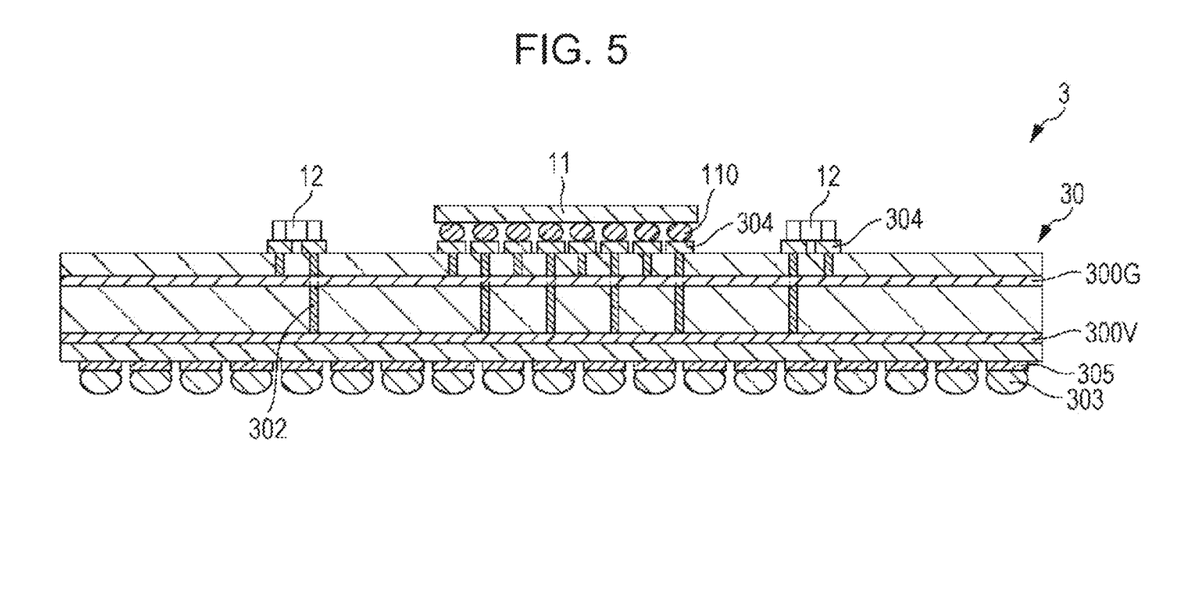
FIG. 5 is a cross-sectional view illustrating an example of the configuration of a semiconductor package of a comparative example.

FIG. 5 is a cross-sectional view illustrating an example of the configuration of a semiconductor package of a comparative example.

A semiconductor package 3 includes a package substrate 30, a semiconductor element 11, and capacitors 12. The package substrate 30 is a multi-layered substrate and includes metallic layers 300V and 300G. The semiconductor element 11 and the capacitors 12 are mounted on the package substrate 30. One end of each of the capacitors 12 is connected through a pad 304 and a via 302 to the metallic layer 300V, and the other end of each of the capacitors 12 is connected to the metallic layer 300G.

The package substrate 30 includes pads 305 and bumps 303 on the lower surface thereof. The metallic layers 300V and 300G are electrically connected to the pads 305 through vias, which are not illustrated. Power is supplied from a power supply circuit, which is not illustrated, to the metallic layers 300V and 300G. The metallic layer 300V has a power supply potential, and the metallic layer 300G has a reference potential.

In the configuration mentioned above, the impedance characteristics of transmission paths between the capacitors 12 and the semiconductor element 11 in the case where the mounting inductance of the bumps 110, the pads 304, the vias 302, and the capacitors 12 is set to ESL=0.1 nH when four capacitors 12 having an electrostatic capacitance of 1 μF (ESR=0.1Ω) are arranged on the package substrate 30 will be described below.

Figure 6:
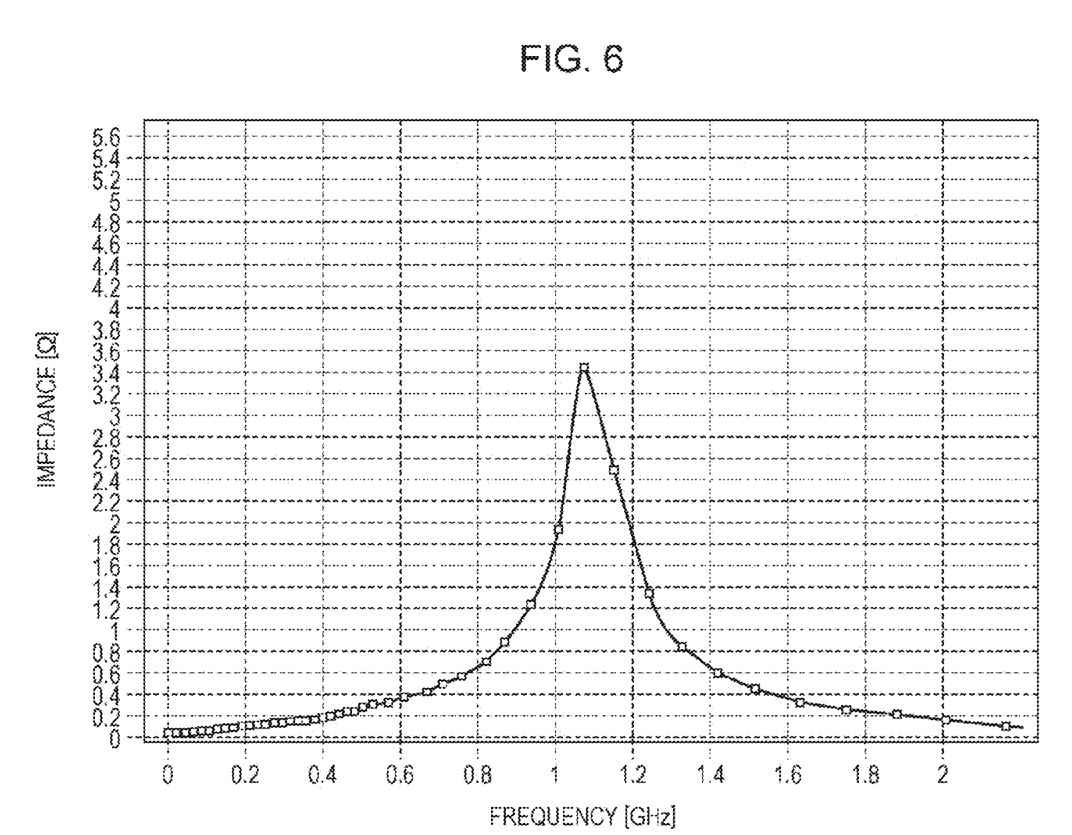
FIG. 6 is a graph illustrating an example of the impedance characteristics of the semiconductor package of the comparative example.

FIG. 6 is a graph illustrating an example of the impedance characteristics of the semiconductor package of the comparative example.

The impedance characteristics of the semiconductor package 3 have the anti-resonance peak in the vicinity of 1 GHz. The value of the anti-resonance peak is 3.4Ω, which is ten times higher than this working example even though the capacitors 12 are arranged on the package substrate 30 as in this working example. In this case, in order to enable the semiconductor element 11 to operate at high speed, a cell including a capacitor for supplying transient current necessary for high-speed operation as well as a cell including a calculating circuit for the semiconductor element 11 needs to be provided.

Working Example 2

Hereinafter, a working example in which a semiconductor element designed for wire bonding is mounted on the package substrate 10, the surface on which the capacitors 12 explained in an exemplary embodiment are mounted, will be explained.

Figure 8A:
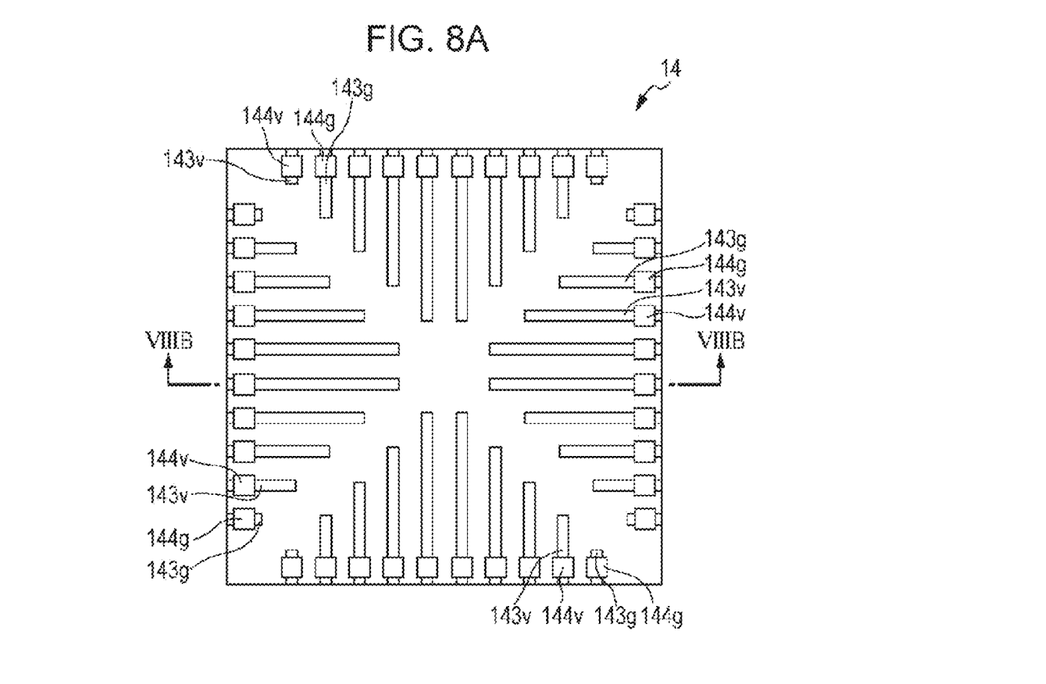
FIG. 8A is a plan view illustrating an example of the configuration of a semiconductor element designed for wire bonding.
Figure 8B:
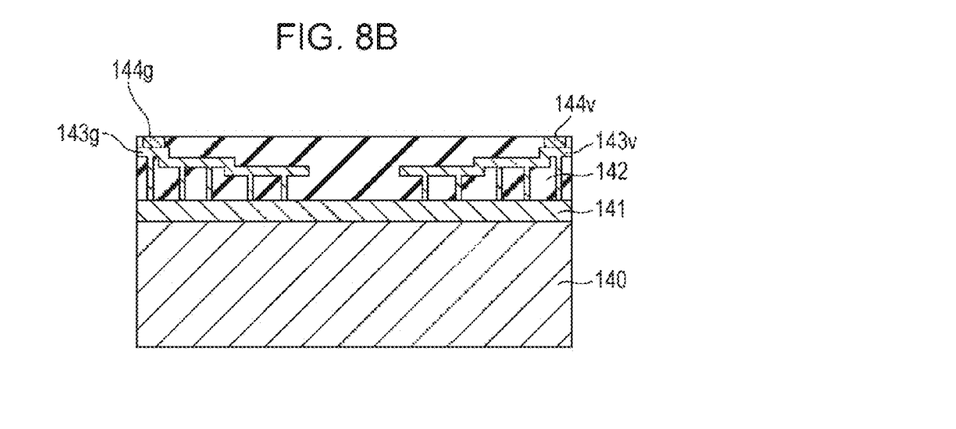
FIG. 8B is a cross-sectional view of the semiconductor element taken along line VIIIB-VIIIB of FIG. 8A.

FIG. 8A is a plan view illustrating an example of the configuration of a semiconductor element designed for wire bonding, and FIG. 8B is a cross-sectional view of the semiconductor element taken along line VIIIB-VIIIB of FIG. 8A.

A semiconductor element 14 includes a silicon substrate 140, a transistor layer 141 that is formed over the silicon substrate 140, an insulating layer 142 that insulates the transistor layer 141 from the outside, power supply wire layers 143v and 143g that are arranged in the insulating layer 142 and that supply power to the transistor layer 141, and power supply pads 144v and 144g that are electrically connected to the power supply wire layers 143v and 143g to be connected to wires for wire bonding.

For example, the power supply wire layers 143v and 143g extend from the center of the semiconductor element 14 when seen in planar view toward four directions and include plural layers in a step-wise manner when seen in cross-sectional view. Furthermore, the power supply wire layers 143v and 143g are alternately arranged when seen in planar view.

The power supply pads 144v and 144g are alternately arranged in the vicinity of surface edges of the semiconductor element 14 when seen in planar view. For the sake of an easier explanation, in FIGS. 8A and 8B, signal lines are not illustrated, and only a feeding configuration used for power supply is illustrated.

Figure 9A:
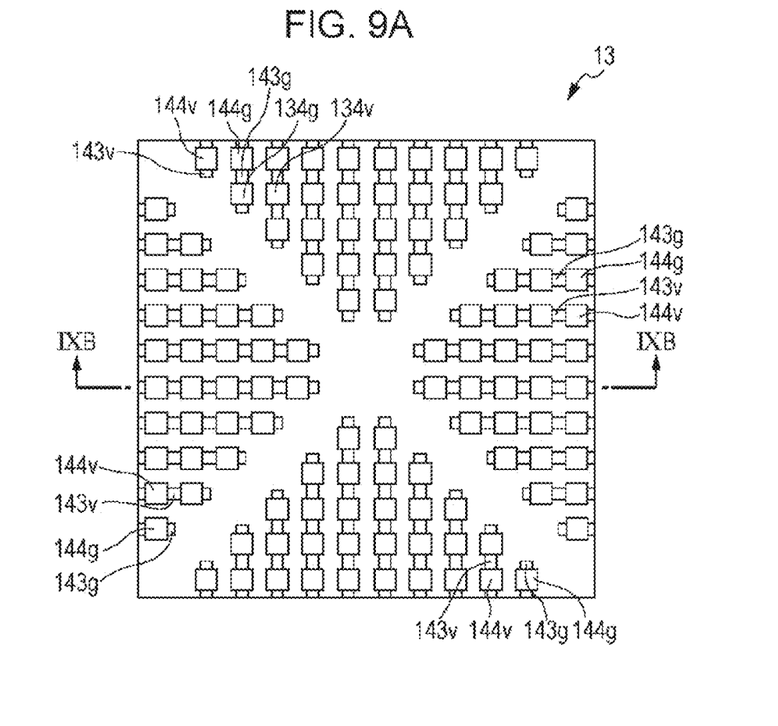
FIG. 9A is a plan view illustrating an example of a semiconductor element obtained by partially changing the configuration of a semiconductor element in order to mount the semiconductor element on a package substrate.
Figure 9B:
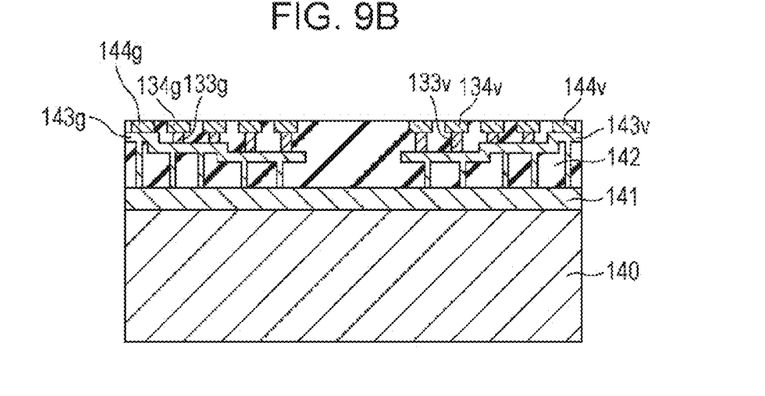
FIG. 9B is a cross-sectional view of the semiconductor element taken along line IXB-IXB of FIG. 9A.

FIG. 9A is a plan view illustrating an example of a semiconductor element obtained by partially changing the configuration of the semiconductor element 14 in order to mount the semiconductor element on the package substrate 10. FIG. 9B is a cross-sectional view of the semiconductor element taken along line IXB-IXB of FIG. 9A.

A semiconductor element 13 is formed by adding power supply wire layers 133v and 133g and power supply pads 134v and 134g to the semiconductor element 14 illustrated in FIG. 8. The power supply wire layers 133v and 133g are arranged in such a manner that wires extend upward from the power supply wire layers 143v and 143g when seen in cross-sectional view. The power supply pads 134v and 134g are arranged on the surface of the semiconductor element 13 so as to correspond to the power supply wire layers 133v and 133g.

It is desirable that the power supply wire layers 133v and 133g and the power supply pads 134v and 134g are arranged in such a manner in order to reduce the impedance in power supply paths to the transistor layer 141, the paths to the connection points between the transistor layer 141 and the power supply wire layers 143v and 143g are shortened as much as possible.

The power supply wire layers 133v and 133g may be formed after the processing of forming the power supply wire layers 143v and 143g of the semiconductor element 14 illustrated in FIG. 8. Alternatively, a new mask may be prepared in photolithography or the like, and the power supply wire layers 133v and 133g may be formed concurrently with the power supply wire layers 143v and 143g.

The power supply pads 134v and 134g may be formed after the processing of forming the power supply pads 144v and 144g of the semiconductor element 14 illustrated in FIG. 8. Alternatively, a new mask may be prepared, and the power supply pads 134v and 134g may be formed concurrently with the power supply pads 144v and 144g.

In FIGS. 9A and 9B, for the sake of an easier explanation, signal lines are not illustrated and only a feeding configuration used for power supply is illustrated. In the case where the power supply wire layers 133v and 133g and the power supply pads 134v and 134g are reformed concurrently with the power supply wire layers 143v and 143g and the power supply pads 144v and 144g, signal lines may be rewired so that the impedance in signal paths may be reduced.

Furthermore, power feeding paths to the transistor layer 141 may be rewired by using only the power supply wire layers 133v and 133g and the power supply pads 134v and 134g, without using the power supply wires 143v and 143g and the power supply pads 144v and 144g.

Figure 10:
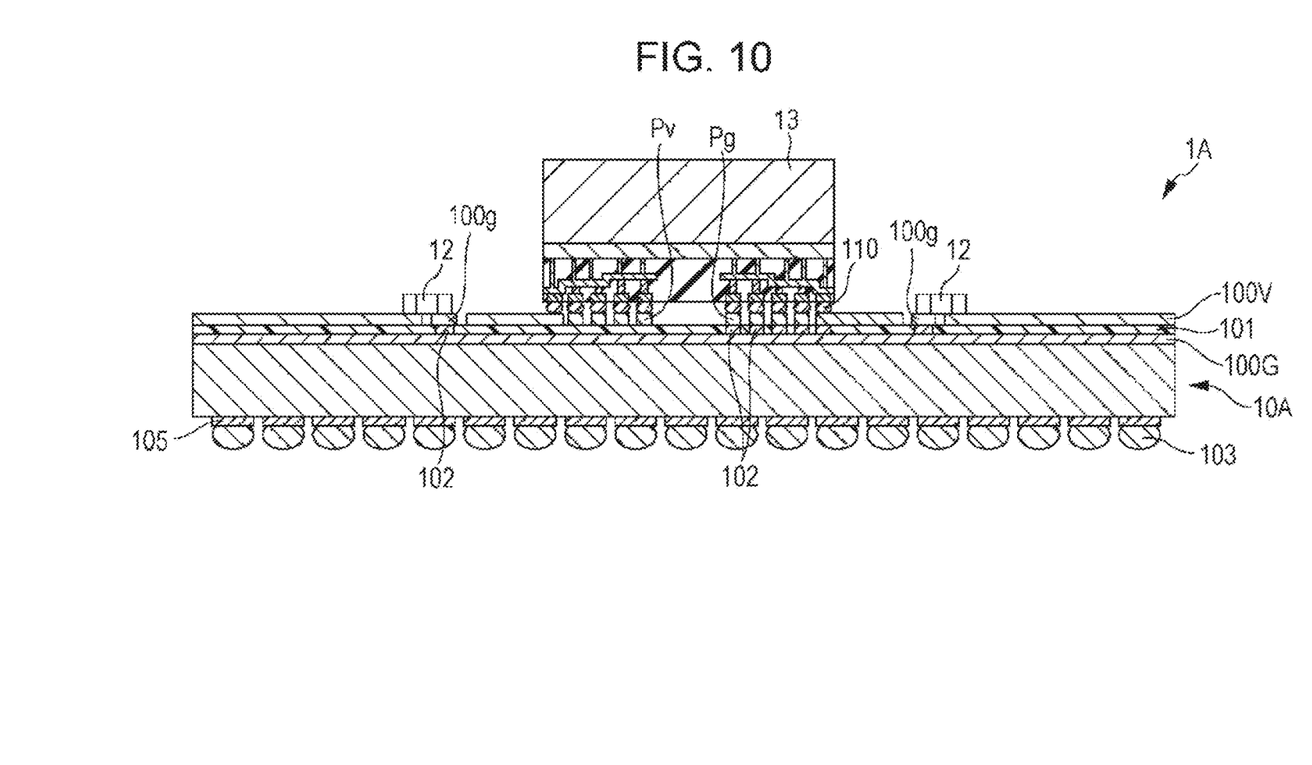
FIG. 10 is a cross-sectional view illustrating an example of the configuration of a semiconductor package in which a semiconductor element is mounted on a package substrate the surface on which capacitors are mounted.

FIG. 10 is a cross-sectional view illustrating an example of the configuration of a semiconductor package in which the semiconductor element 13 is mounted on a package substrate 10A, the surface on which the capacitors 12 are mounted.

A semiconductor package 1A includes the package substrate 10A including the metallic layer 100V having a semiconductor element mounting region and a capacitor element mounting region, the dielectric layer 101 arranged below the metallic layer 100V, and the metallic layer 100G arranged below the dielectric layer 101. The semiconductor package 1A also includes the semiconductor element 13 arranged in the semiconductor element mounting region of the metallic layer 100V and the capacitors 12 arranged in the capacitor element mounting region of the metallic layer 100V and supplying transient current to the semiconductor element 11.

Power is supplied via the bumps 103 to the metallic layers 100V and 100G. For example, the metallic layer 100V has a power supply potential, and the metallic layer 100G has a reference potential.

The semiconductor element 13 is mounted on the pads Pv and Pg of the package substrate 10A with the bumps 110 therebetween. Power is supplied from the metallic layers 100V and 100G to the pads Pv and Pg, and the semiconductor element 13 receives supplied power. Pads for signal lines of the semiconductor element 13, which are not illustrated, are electrically connected to other pads, which are not illustrated, and another layer of the package substrate 10A, which is not illustrated, and transmit and receive signals other than power supply.

With the configuration described above, the metallic layer 100V, the dielectric layer 101, and the metallic layer 100G form capacitors and are used as transmission paths for supplying transient current from the capacitors 12 to the semiconductor element 13.

With the configuration described above, by forming the semiconductor element 13 by adding the power supply wire layers 133v and 133g and the power supply pads 134v and 134g without changing the design of the transistor layer 141 of the semiconductor element 14 designed for wire bonding, the semiconductor element 13 may be mounted on the package substrate 10A. In addition, the impedance of transmission paths for supplying transient current to the semiconductor element 13 may be reduced compared to the case where the semiconductor element 13 is mounted on a package substrate (20, 30, or 40) of comparative examples or a related art.

Other Embodiments

The present invention is not limited to the exemplary embodiments described above. Various modifications may be made to the present invention without departing from the gist of the present invention.

For example, an insulating film or the like may be formed in a region other than the regions of the surface of the metallic layer 100V in which the capacitors 12 and the semiconductor element 11 are mounted.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor package comprising:
a semiconductor element;
a capacitor that supplies transient current to the semiconductor element; and
a package substrate on which the semiconductor element and the capacitor are mounted,
wherein the semiconductor element includes
an integrated circuit,
a first connecting part that connects the integrated circuit to one of an external power supply potential and an external reference potential, and
a second connecting part that connects the integrated circuit to the other one of the power supply potential and the reference potential,
wherein the capacitor includes
a third connecting part that is connected to one of the power supply potential and the reference potential, and
a fourth connecting part that is connected to the other one of the power supply potential and the reference potential,
wherein the package substrate includes
a first metallic layer,
a second metallic layer, and
a dielectric layer that is arranged between the first metallic layer and the second metallic layer,
wherein the first metallic layer includes
a first conductive region in which one of the first connecting part and the second connecting part of the semiconductor element is mounted,
a second conductive region in which the other one of the first connecting part and the second connecting part of the semiconductor element is mounted,
a third conductive region in which one of the third connecting part and the fourth connecting part of the capacitor is mounted, and
a fourth conductive region in which the other one of the third connecting part and the fourth connecting part of the capacitor is mounted,
wherein the first conductive region is connected via a fifth connecting part to the second metallic layer,
wherein the third conductive region is connected via a sixth connecting part to the second metallic layer, and
wherein the second conductive region and the fourth conductive region are connected to each other inside the first metallic layer.

2. The semiconductor package according to claim 1,
wherein the first metallic layer, the second metallic layer, and the dielectric layer form a transmission path for supplying the transient current from the capacitor to the semiconductor element, and
wherein in a frequency bandwidth of the transient current, the impedance of the transmission path is lower than the impedance of the capacitor.

3. The semiconductor package according to claim 1,
wherein the first metallic layer, the second metallic layer, and the dielectric layer form a transmission path for supplying the transient current from the capacitor to the semiconductor element, and wherein the impedance of the transmission path is approximately 0.1Ω or less at a frequency of approximately 2.0 GHz or less.

4. The semiconductor package according to claim 1, wherein the first conductive region and the second conductive region are surrounded with the fourth conductive region.

5. The semiconductor package according to claim 4, wherein the first conductive region and the second conductive region are arranged at a substantially central area of the package substrate.

6. The semiconductor package according to claim 4, wherein the fourth conductive region has a shape that surrounds, with a continuous surface thereof, the first conductive region and the second conductive region.

7. The semiconductor package according to claim 1, wherein the third conductive region is surrounded with the fourth conductive region.

8. The semiconductor package according to claim 7, wherein the fourth conductive region has a shape that surrounds, with a continuous surface thereof, the third conductive region.

9. The semiconductor package according to claim 1, wherein the fourth conductive region has a shape that surrounds, with a continuous surface thereof, the first conductive region, the second conductive region, and the third conductive region.

10. The semiconductor package according to claim 1, wherein the dielectric layer is a resin thin film made of polyimide.

11. The semiconductor package according to claim 1, wherein the dielectric layer has a thickness of approximately 100 μm or less.

12. The semiconductor package according to claim 1, wherein the dielectric layer has a thickness of approximately 30 μm or less.

13. The semiconductor package according to claim 1, wherein the dielectric layer has a thickness of approximately 15 μm or less.

14. The semiconductor package according to claim 1, wherein the first connecting part, the second connecting part, the third connecting part, and the fourth connecting part are bumps.

15. The semiconductor package according to claim 1, wherein the fifth connecting part and the sixth connecting part are vias.

16. The semiconductor package according to claim 1, wherein the first metallic layer, the second metallic layer, and the dielectric layer are arranged at positions closer to a face of the package substrate on which the semiconductor element is mounted than a central plane of the package substrate in a thickness direction of the package substrate.

17. A package substrate on which a semiconductor element and a capacitor are mounted, the semiconductor element including an integrated circuit, a first connecting part that connects the integrated circuit to one of an external power supply potential and an external reference potential, and a second connecting part that connects the integrated circuit to the other one of the power supply potential and the reference potential, the capacitor including a third connecting part that is connected to one of the power supply potential and the reference potential and a fourth connecting part that is connected to the other one of the power supply potential and the reference potential, the package substrate comprising:

a first metallic layer;

a second metallic layer; and a dielectric layer arranged between the first metallic layer and the second metallic layer, wherein the first metallic layer includes a first conductive region in which one of the first connecting part and the second connecting part of the semiconductor element is mounted, a second conductive region in which the other one of the first connecting part and the second connecting part of the semiconductor element is mounted, a third conductive region in which one of the third connecting part and the fourth connecting part of the capacitor is mounted, and a fourth conductive region in which the other one of the third connecting part and the fourth connecting part of the capacitor is mounted, wherein the first conductive region is connected via a fifth connecting part to the second metallic layer, wherein the third conductive region is connected via a sixth connecting part to the second metallic layer, and wherein the second conductive region and the fourth conductive region are connected to each other inside the first metallic layer.

18. The package substrate according to claim 17, wherein the dielectric layer has a thickness of approximately 100 μm or less, wherein the first connecting part, the second connecting part, the third connecting part, and the fourth connecting part are bumps, wherein the fifth connecting part and the sixth connecting part are vias, wherein the first conductive region and the second conductive region are surrounded with the fourth conductive region, wherein the first metallic layer, the second metallic layer, and the dielectric layer form a transmission path for supplying transient current from the capacitor to the semiconductor element, and wherein in a frequency bandwidth of the transient current, the impedance of the transmission path is lower than the impedance of the capacitor.

* * * * *